United States Patent
Knepper et al.

(10) Patent No.: US 6,502,991 B2
(45) Date of Patent: Jan. 7, 2003

(54) ROTARY FLUID BEARING COATINGS AND COINING AND PROCESSES FOR MANUFACTURING THE SAME

(75) Inventors: Richard A. Knepper, Keene, NH (US); Gary L. Doll, Canton, OH (US); Thomas Underwood, East Swanzey, NH (US)

(73) Assignee: The Timken Company, Canton, OH (US)

(*) Notice: Subject to any disclaimer, the term of this patent is extended or adjusted under 35 U.S.C. 154(b) by 2 days.

(21) Appl. No.: 09/808,450

(22) Filed: Mar. 14, 2001

(65) Prior Publication Data

US 2002/0131656 A1 Sep. 19, 2002

(51) Int. Cl.$^7$ ............................ F16C 32/06; B23P 11/00
(52) U.S. Cl. ........................ 384/110; 29/432; 29/432.2
(58) Field of Search .................... 384/107, 1, 110; 29/424, 428, 432, 432.1, 432.2, 434, 898, 898.043, 898.09, 898.12, 898.14

(56) References Cited

U.S. PATENT DOCUMENTS

| | | |
|---|---|---|
| 4,731,302 A | 3/1988 | Weissmantel et al. |
| 4,797,009 A * | 1/1989 | Yamazaki .................... 384/100 |
| 4,838,710 A | 6/1989 | Ohta et al. |
| 4,998,033 A | 3/1991 | Hisabe et al. |
| 5,067,826 A | 11/1991 | Lemelson |
| 5,142,173 A | 8/1992 | Konno et al. |
| 5,165,804 A | 11/1992 | Fisher et al. |
| 5,209,578 A * | 5/1993 | Eastham et al. ............. 384/276 |
| 5,322,735 A | 6/1994 | Fridez et al. |
| 5,366,298 A | 11/1994 | Toshimitsu et al. |
| 5,482,602 A | 1/1996 | Cooper et al. |
| 5,549,398 A | 8/1996 | Van Brakel et al. |
| 5,593,234 A | 1/1997 | Liston |
| 5,700,094 A | 12/1997 | Dam et al. |
| 5,709,480 A | 1/1998 | Hong |
| 5,718,516 A | 2/1998 | Cheever et al. |
| 5,734,530 A | 3/1998 | Kim |
| 5,887,985 A | 3/1999 | Loree, II et al. |
| 5,998,898 A | 12/1999 | Fukutani et al. |

FOREIGN PATENT DOCUMENTS

| | | |
|---|---|---|
| GB | 2313633 | 3/1997 |
| JP | 051042 | 5/1999 |
| JP | 132224 | 8/1999 |
| WO | 9846894 | 10/1998 |
| WO | 9914512 | 3/1999 |

* cited by examiner

Primary Examiner—Christopher P. Schwartz
(74) Attorney, Agent, or Firm—Polster, Lieder, Woodruff & Lucchesi, L.C.

(57) ABSTRACT

A protective coating is applied to an inner or an outer member of a rotary fluid bearing by sputtering to minimize scuffing, wear and premature failure of the members during starts and stops of the bearing. The coating may include titanium, tungsten, chromium, amorphous carbon with or without metallic impurities, and hydrogenated amorphous carbon with or without metallic impurities. One of the members is formed in two sections to accommodate assembly of the bearing and these sections abut at end faces. Features on each end face are imparted to the other end face in a compression coining process to facilitate rapid and repeatable alignment of the two sections when separated and rejoined during subsequent manufacturing steps.

27 Claims, 3 Drawing Sheets

ROTARY FLUID BEARING COATINGS AND COINING AND PROCESSES FOR MANUFACTURING THE SAME

CROSS-REFERENCE TO RELATED APPLICATIONS

STATEMENT REGARDING FEDERALLY SPONSORED RESEARCH OR DEVELOPMENT

Not Applicable.

BACKGROUND OF THE INVENTION

This invention relates in general to bearings and more particularly to a rotary fluid bearing and a process for manufacturing the same.

The typical fluid bearing includes a journal and a hub, one of which rotates with respect to the other. Sometimes a small electric motor is integrated into the journal and hub to effect the rotation. The journal and hub have matching surfaces which, during the operation of the bearing, are separated by a thin layer of fluid. In this sense, a fluid may comprise any material, such as a liquid or gas that possesses fluid properties or characteristics. Hence, the surfaces do not contact each other and essentially no friction exists to impede the rotation. The fluid for the layer, and the pressure associated with the fluid, may come from an external source (hydrostatic) or it may derive from the rotation itself (hydrodynamic). Bearings which operate on the latter principle normally have grooves in the surfaces of the journal or hub to elevate the fluid pressure in the gap between opposed thrust-oriented surfaces. Such bearings are referred to as self-acting bearings.

However, the journal and hub in a self-acting bearing contact one another when the bearing is not rotating or otherwise not in use. Each time the bearing activates, the hub and journal surfaces that are in contact rub against one another during initial rotation, that is, before sufficient fluid pressure separates the surfaces. The journal and hub surfaces thereby suffer scuffing and wear, which leads to inefficiency and premature failure. If one of the bearing members has an epoxy or resin liner that chemically reacts with the metal of the opposing bearing member, such as aluminum or steel, physical contact between the members intensifies the inefficiencies and accelerates premature failure.

Further, in certain configurations the self-acting fluid bearing has its opposed thrust-oriented surfaces tapered, indeed, down from each end toward the mid-region of the bearing. The tapers, in effect, capture the hub on the journal, but this presents manufacturing problems. In this regard, the tapered regions of the journal are normally manufactured separately and then assembled within the hub. Since the two tapered regions are not machined on the same center, the possibility exists that their axes may not coincide precisely as they must when assembled in the hub. This can produce error in motion. In addition, the surfaces conjoining between the two tapered regions must be manufactured so as to prevent any slippage at the interface during bearing rotation.

SUMMARY OF THE INVENTION

The present invention resides in the formulation for, and process of applying, a coating on one or more of the internal members of the bearing that has a lower coefficient of friction and lower chemical reactivity than the material it coats, and in the "coining" of features on the abutting end faces of two separable sections of the internal bearing member.

The present invention greatly reduces the scuffing and wear associated with starting and stopping the bearing, and eliminates the chemical reaction between the liner and opposing metal bearing components, through the application of a specially formulated and applied coating on one or more of the internal members of the bearing. The coating may also be formulated to increase the hardness of the substance it coats.

The present invention also resides in "coining" features onto the surfaces of the tapered sections abutting one another that thereafter properly mate with one another in only one position. The present invention provides an alignment mechanism that also eliminates lateral slippage of the sections when they are conjoined. In this way, the sections can be quickly, reliably and repeatably aligned together properly to enable multiple manufacturing steps that separate and rejoin the sections, including final bearing assembly.

BRIEF DESCRIPTION OF THE SEVERAL VIEWS OF THE DRAWINGS

In the accompanying drawings, which form part of the specification and wherein like numerals and letters refer to the like parts, wherever they occur.

Corresponding reference numerals will be used throughout the several figures of the drawings.

DETAILED DESCRIPTION

In the preferred embodiment, a self-acting fluid bearing A (FIG. 1) includes a fixed journal 2 and a rotary hub 4 which fits around the journal 2 where it revolves about an axis X of rotation, the common axis of the journal 2 and the hub 4. The journal 2 constitutes the inner member of the bearing A, whereas the hub 4 represents the outer member. The journal 2 has a low friction coating C bonded to it. The hub 4 has a molded liner 6 bonded to it, with the liner 6 being presented inwardly toward the journal 2 such that small gaps G exist between the liner 6 and coating C on the journal. A fluid component is present in the gaps G. This fluid consists of air in the preferred embodiment, but may comprise any substance, including gases and liquids, that exhibits fluid characteristics. Further, the bearing A may contain an electric motor 8 which, when energized, imparts torque to the hub 4, causing the hub 4 to rotate about the axis X at high velocity.

Figure 1:
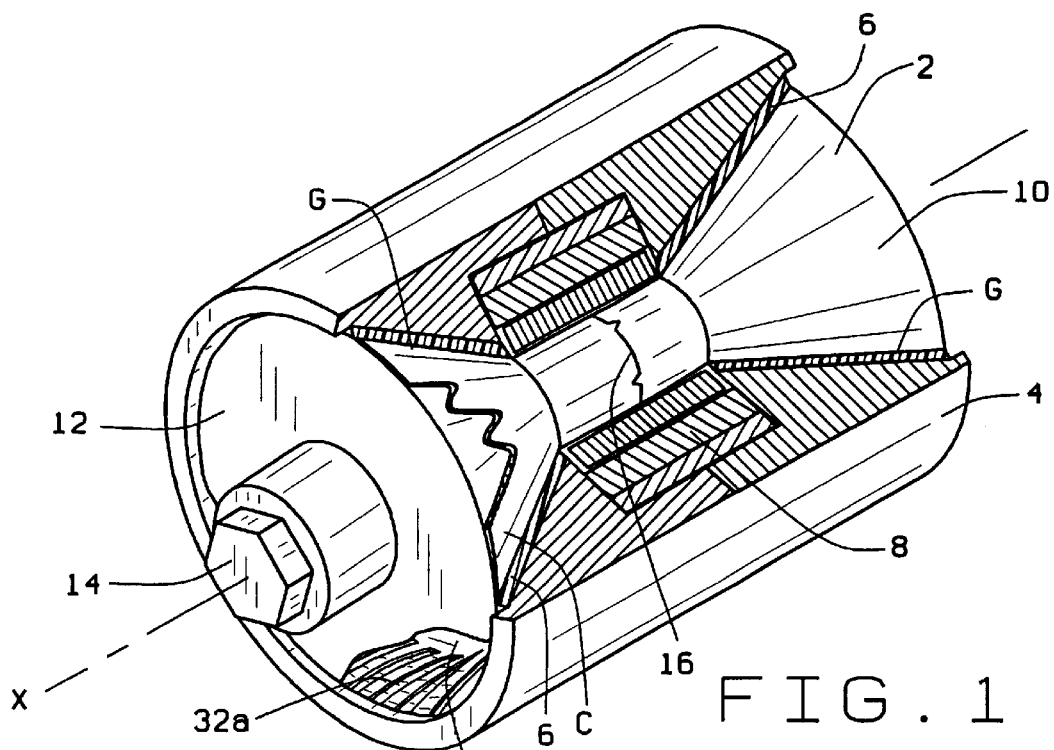
FIG. 1 is a perspective view, partially broken away and in section, of a fluid bearing constructed in accordance with the process of and embodying the present invention.
Figure 2:
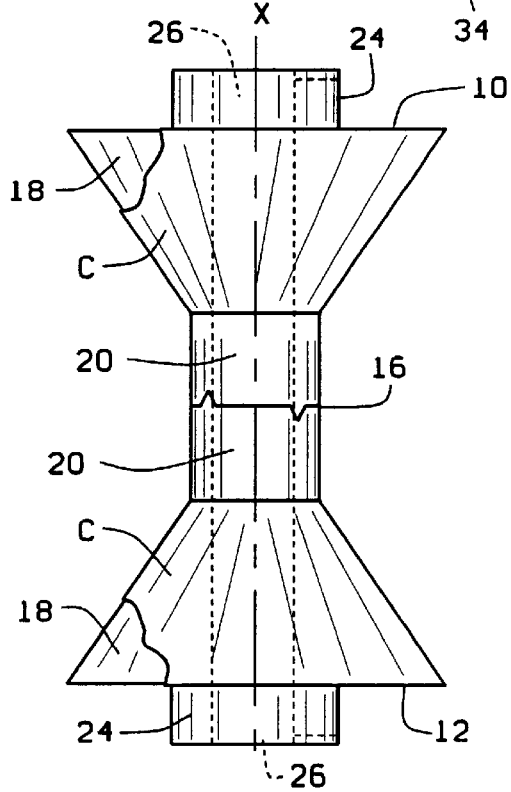
FIG. 2 is an elevational view of the journal for the bearing.

The journal 2 is formed from a hardenable steel, such as 440C, and exists in two sections 10 and 12 which are held firmly together by a machine screw 14 (FIG. 1). The sections 10 and 12, which are essentially identical, abut along an interface 16. Each section 10 and 12 has a cylindrical surface 20 and a conical surface 18 which tapers downwardly toward the cylindrical surface 20 (FIG. 2), with the conical envelopes formed by the two surfaces preferably having their apices at a common point along the axis X. When the two sections are held together in the bearing A, the conical surfaces 18 of the two sections 10 and 12 are separated by the intervening cylindrical surfaces 20. At their opposite or large ends, the two sections 10 and 12 have cylindrical spindles 24 which are directed axially beyond the ends of the conical surfaces 18.

The journal 2 also contains a through bore 26 that extends axially between the two spindles 24 and indeed opens out of the ends of the journal 2 at the spindles 24. The through bore 26, which likewise has its axis coincident with the axis X, receives the screw 14 which holds the two sections 10 and 12 firmly together at an interface 16.

Figure 3:
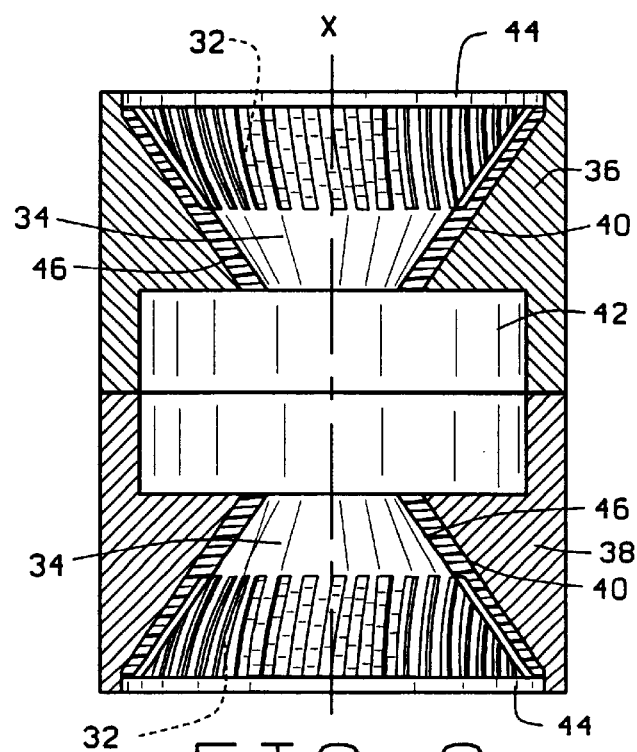
FIG. 3 is a sectional view of the hub for the bearing with the polymer liner and grooves in the liner.

The hub 4 is formed from a light weight and durable substance, such as aluminum, in two axially aligned sections 36 and 38 (FIG. 3) which are held together by a suitable clamping device. The hub 4 has conical surfaces 40 which are presented inwardly toward the axis X and taper downwardly to an intervening cavity 42 that lies between them and is accessible when the sections 36 and 38 are separated. The cavity 42 houses the motor 8. At their opposite ends the conical surfaces 40 open into short end bores 44 which, in turn, open out of the ends of the hub 4. The conical surfaces 40 of the hub 4, insofar as their taper is concerned, conform to the conical surfaces 18 of the journal 2, but are somewhat larger. Indeed, the conical surfaces 40 of the hub 4 lie between 0.005 and 0.04 inches, and preferably about 0.015 inches, measured radially, beyond the coating C on the opposing conical surfaces 18 of the journal 2. This spacing far exceeds the size of the gaps G.

The liner 6 has spiral grooves 32, which open out atop the conical surfaces 40 of the hub 4, yet are quite shallow. The process for forming the grooves 32 in the liner 6 is explained in Timken's co-pending U.S. patent application Ser. No. 09/403,881, filed on Oct. 15, 1999, and International Patent No. WO 98/46894, published on Oct. 22, 1998, both entitled "ROTATRY AIR BEARING AND PROCESS FOR MANUFACTURING THE SAME." The grooves 32 extend all the way out to the large ends of the conical surfaces 40, near to the end bores 44, but terminate short of the small ends so that continuous or smooth frustoconical lands 34 exist atop the conical surfaces 40 between the ends of the grooves 32 and the cylindrical intervening cavity 42. The grooves 32 serve to pressurize the fluid F in the gaps G, when the hub 4 revolves about the journal 2, particularly in the regions around the lands 34.

The low friction liner 6 (FIG. 1) bonds to the conical surfaces 40 of the hub 4 and occupies most of the space between those surfaces and the coating C on the conical surfaces 18 and of the journal 2. It too has conical surfaces 46 which conform in taper to the tapered surfaces 18 of journal 2, yet lie slightly beyond the surfaces 18, so that small clearances exist between the conical surfaces 46 of the liner 6 and the conical surfaces 18 of the journal 2 when the bearing A is in operation. Those clearances form the gaps G which, measured radially, should range between 30 and 100 microinches, and preferably about 50 microinches. The liner 6 has a generally consistent thickness across the conical surfaces 40 of hub 4. The liner 6 derives from a replicant, such as epoxy resin, which when hardened on the hub 4, should have a low coefficient of friction against a smooth steel surface, such as the conical surfaces 18 of the journal 2. Resins sold by Master Bond, Inc. of Hackensack, N.J., under the trademark MASTER BOND possess the desired characteristics and are suitable for the liner 6.

Finally, in this embodiment the bearing is motorized. The motor 8, which may be a brushless D.C. motor, mounts upon the intervening surface 20 of the journal 2 and within the cavity 42 of the hub 4. The leads for supplying the motor 8 with electrical energy pass through the bore 26 in the journal 2. When energized, the motor 8 exerts a torque on the hub 4, causing the hub 4 to rotate around the journal 2.

Initially, before the motor 8 is energized, some of the conical surfaces 46 of the resin liner 6 may rest against the coating C on the conical surfaces 18 of the journal 2. However, as the hub 4 accelerates, it pressurizes the air in the gaps G, particularly in the regions between the conical surfaces 18 of the journal 2 and the frustoconical regions 34 on the conical surfaces 46 of the liner 6. A layer of air develops in the gaps G for the full circumferences of the gaps G, and the hub 4 and its liner 6 separate from the journal 2 and the coating C on the journal and, in effect, float on the cushion of air in the gaps G. The air pressure necessary to sustain the separation between the journal 2 and hub 4 derives from the rotation itself, or in other words, the bearing A acts as a pump which forces fluid F, in this case air, into the gaps G. With the conical surfaces 46 and the coating C on the opposing conical surface 18 being separated by a layer of air, essentially no friction exists between the hub 4 and the journal 2, and the air, having extremely low viscosity, does little to impede the rotation. The hub 4 rotates freely and carries a payload, such as a disk or a multi-surface mirror.

Were it not for the coating C, each time the motor 8 is initially energized or each time the journal 2 and hub 4 of the fluid bearing otherwise rotate against each other, the conical surfaces 46 of the resin liner 6 would rub against the conical surfaces 18 of the journal 2, causing friction, scuffing and/or other wear at those surfaces. In addition, chemo-mechanical reactions between the materials composing the liner 6 and the conical surfaces 18 might result in undesirable oxidation at the interface. Such wear and oxidation lead to bearing inefficiencies and premature failure. The coating C provides low friction and hardness, thereby allowing the liner 6 and surfaces 18 to freely slide over one another with minimal scuffing or wear. The coating C also exhibits a low chemical reactivity to the material in the surfaces 18 that thereby insulates the liner 6 from the surfaces 18, and inhibits chemical reaction between them. Hence, the incorporation of coating C onto the surfaces 18 markedly reduces the risk of premature fluid bearing failure.

Figure 9:
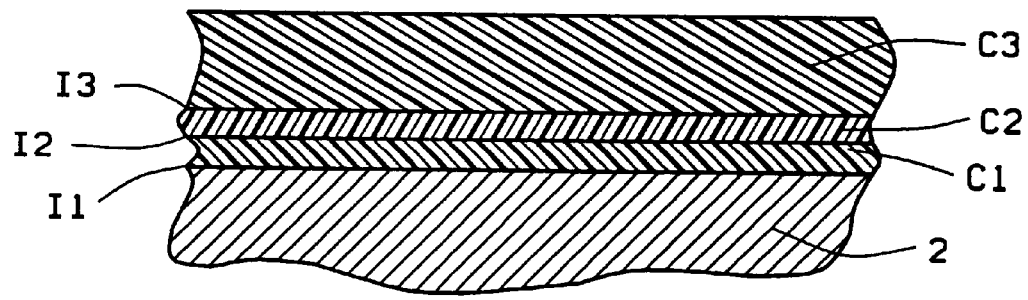
FIG. 9 is a cross-sectional view of the protective coating on the journal.

The coating C (FIG. 9), having a thickness significantly thinner than the gap G, is applied to the journal 2, and comprises an adhesion layer C1, a gradient layer C2, and a final layer C3. The adhesion layer C1 enhances the adhesion between the coating C and the surface of the journal 2 through physical and chemical bonding. The gradient layer C2 provides a stress-relieving buffer zone in the form of a gradual compositional transition from material comprising the adhesion layer C1 to the material comprising the final layer C3. The gradient layer C2 minimizes otherwise inherent mechanical weaknesses in the coating caused by interlayer stresses. The final layer C3 lends the desired characteristics of low friction, hardness, and low chemical reactivity to the surfaces 18 of the journal 2. Three interfaces are thereby formed along the different layers of coating C.

An interface 11 exists between the surface 18 of journal 2 and adhesion layer C1, an interface 12 exists between adhesion layer C1 and the gradient layer C2, and an interface 13 exists between the gradient layer C2 and the final layer C3. Both the interfaces 12 and 13, each constituting a transition between different layers of a single coating C, are somewhat diffuse and indistinct.

The coating C may consist of the final layer C3 essentially comprising sputtered amorphous carbon with titanium impurities, the adhesion layer C1 essentially comprising sputtered titanium, and the gradient layer C2 essentially comprising a mixture of sputtered titanium and sputtered amorphous carbon wherein the amorphous carbon content gradually increases across the layer C2 from essentially 0 atomic percent at the interface 12 with the adhesion layer to a level of 90 to 100 atomic percent, and preferably 95 to 97 atomic percent, at the interface 13 with the final layer. In this configuration, the thickness of adhesion layer C1 should be between 0.01 and 1.00 micrometers, and preferably about 0.10 micrometers, the thickness of gradient layer C2 should be between 0.01 and 1.00 micrometers, and preferably about 0.10 micrometers, and the thickness of final layer C3 should be between 0.10 and 5.00 micrometers, and preferably between 0.80 and 0.90 micrometers. Furthermore, the final layer should have a titanium to carbon impurity level of approximately 1 to 20 atomic percent, and preferably 5 to 15 atomic percent, a physical structure incorporating 1.0 to 3.0 nanometer titanium carbide particles embedded in a matrix of amorphous carbon, a hardness of 5 to 25 gigapascals, and preferably 15 gigapascals, as measured using nanoindention techniques, a dry sliding friction coefficient of approximately 0.02 to 0.14, and preferably less than 0.08, measured at a rate of 50 centimeters per second with a 1.0 gigapascal load at 25% relative humidity, and a rms_ surface roughness of approximately 1 to 10 nanometers, and preferably 5 nanometers.

To acquire such a configuration, the coating C is applied to the journal 2 through a continuous sputtering process. First, the journal 2 is placed in an unbalanced magnetron sputtering system and subjected to an argon gas plasma etch to remove contaminants and generate nucleation sites for adhesion. Then, the adhesion layer C1 is applied using a titanium deposition target. Upon reaching the desired adhesion layer thickness, a carbon deposition target is introduced into the ongoing sputtering process to begin depositing amorphous carbon along with titanium. This forms the interface I2 between the adhesion layer C1 and gradient layer C2. Thereupon, adjustments are made to control settings for the sputtering system to gradually increase the deposition rate of the carbon while simultaneously reducing the deposition rate of the titanium. This forms the gradient layer C2. Upon reaching the desired composition for the interface I3 between the gradient layer C2 and the final layer C3, the sputtering continues uninterrupted while the deposition rates for the amorphous carbon and the titanium thereafter remain constant. Upon achieving the desired thickness for the final layer C3, the sputtering system is shut off and the newly coated journal 2 is removed.

The coating C may also consist of the final layer C3 essentially comprising sputtered hydrogenated amorphous carbon with titanium impurities, the adhesion layer C1 essentially comprising sputtered titanium, and the gradient layer C2 essentially comprising a mixture of sputtered titanium and sputtered hydrogenated amorphous carbon wherein the hydrogenated amorphous carbon content gradually increases across the layer C2 from essentially 0 atomic percent at the interface I2 with the adhesion layer to a level of 80 to 100 atomic percent, and preferably 85 to 95 atomic percent, at the interface 13 with the final layer. In this configuration, the thickness of adhesion layer C1 should be between 0.01 and 1.00 micrometers, and preferably about 0.10 micrometers, the thickness of gradient layer C2 should be between 0.01 and 1.00 micrometers, and preferably about 0.10 micrometers, and the thickness of final layer C3 should be between 0.10 and 5.00 micrometers, and preferably between 2.00 and 3.00 micrometers. Furthermore, the final layer should have a titanium impurity level of approximately 1 to 20 atomic percent, and preferably 5 to 15 atomic percent, a physical structure incorporating 1.0 to 3.0 nanometer titanium carbide particles embedded in a matrix of hydrogenated amorphous carbon, a hardness of 5 to 50 gigapascals, and preferably 15 to 25 gigapascals, as measured using nanoindention techniques, a dry sliding friction coefficient of approximately 0.05 to 0.25, and preferably 0.10 to 0.15, measured at a rate of 50 centimeters per second with a 1.0 gigapascal load at 25% relative humidity and a rms surface roughness of approximately 5 to 25 nanometers, and preferably 10 to 20 nanometers.

To acquire such a configuration, the coating C is also applied to the journal 2 through a continuous sputtering process. First, the journal 2 is placed in an unbalanced magnetron sputtering system and subjected to an argon gas plasma etch to remove contaminants and generate nucleation sites for adhesion. Then, the adhesion layer C1 is applied using a titanium deposition target. Upon reaching the desired adhesion layer thickness, argon and acetylene gases, and a carbon deposition target are introduced into the ongoing sputtering process to begin depositing hydrogenated amorphous carbon along with titanium. This forms the interface I2 between the adhesion layer C1 and gradient layer C2. Thereupon, adjustments are made to control settings for the sputtering system to gradually increase the deposition rate of the hydrogenated amorphous carbon while simultaneously reducing the deposition rate of the titanium. This forms the gradient layer C2. Upon reaching the desired composition for the interface I3 between the gradient layer C2 and the final layer C3, the sputtering continues uninterrupted while the deposition rates for both the hydrogenated amorphous carbon and the titanium thereafter remain constant. Upon achieving the desired thickness for the final layer C3, the sputtering system is shut off and the newly coated journal 2 is removed.

The coating C may also consist of the final layer C3 essentially comprising sputtered hydrogenated amorphous carbon with tungsten impurities, the adhesion layer C1 essentially comprising sputtered chromium, and the gradient layer C2 essentially comprising a mixture of sputtered chromium and sputtered hydrogenated amorphous carbon and tungsten wherein the hydrogenated amorphous carbon to tungsten content gradually increases across the layer C2 from essentially 0 atomic percent at the interface I2 with the adhesion layer to a level of 80 to 90 or 100 atomic percent, and preferably 85 to 95 atomic percent, at the interface I3 with the final layer. In this configuration, the thickness of adhesion layer C1 should be between 0.01 and 1.00 micrometers, and preferably about 0.10 micrometers, the thickness of gradient layer C2 should be between 0.01 and 1.00 micrometers, and preferably about 0.10 micrometers, and the thickness of final layer C3 should be between 0.10 and 5.00 micrometers, and preferably between 2.00 and 3.00 micrometers. Furthermore, the final layer should have a tungsten impurity level of approximately 1 to 20 atomic percent, and preferably 10 to 15 atomic percent, a physical structure incorporating 1.0 to 3.0 nanometer tungsten carbide particles embedded in a matrix of hydrogenated amorphous carbon, a hardness of 5 to 30 gigapascals, and preferably 15 to 25 gigapascals, as measured using nanoindention techniques, a dry sliding friction coefficient of approximately 0.05 to 0.25, and preferably 0.10 to 0.15, measured at a rate of 50 centimeters per second with a 1.0 gigapascal load at 25% relative humidity, and a rms surface roughness of approximately 5 to 25 nanometers, and preferably 10 to 20 nanometers.

To acquire such a configuration, the coating C is also applied to the journal 2 through a continuous sputtering process. First, the journal 2 is placed in an unbalanced magnetron sputtering system and subjected to an argon gas plasma etch to remove contaminants and generate nucleation sites for adhesion. Then, the adhesion layer C1 is applied using a chromium deposition target. Upon reaching the desired adhesion layer thickness, argon and acetylene gases, a carbon deposition target and a tungsten deposition are introduced into the ongoing sputtering process to begin depositing hydrogenated amorphous carbon and tungsten along with chromium. This forms the interface I2 between the adhesion layer C1 and gradient layer C2. Thereupon, adjustments are made to control settings for the sputtering system to gradually increase the deposition rate of the hydrogenated amorphous carbon and tungsten while simultaneously reducing the deposition rate of the chromium. This forms the gradient layer C2. Upon reaching the desired composition for the interface 13 between the gradient layer C2 and the final layer C3, wherein the chromium target has been removed from the sputtering operation and the chromium deposition rate essentially equals zero, the sputtering continues uninterrupted while the deposition rates for the hydrogenated amorphous carbon and the tungsten thereafter remain constant. Upon achieving the desired thickness for the final layer C3, the sputtering system is shut off and the newly coated journal 2 is removed.

In addition, sections 10 and 12 of journal 2 (FIGS. 7 and 8) further comprise a face F1 and a face F2, respectively, where each face F1 and F2 is on the end of its respective member opposite the spindle 24 for that member. Both the faces F1 and F2 are perpendicular to axis X and mate against one another when the journal 2 is assembled. The faces F1 and F2 are both circular, concentric with the axis X, and comprise primarily flat surfaces S1 and S2, respectively, through which passes the through bore 26. Rising from the face F1 are ridges R1 and R2, wherein the spines of both ridges are collinear along a diameter of the face F1. Likewise, rising from the face F2 are ridges R3 and R4, wherein the spines of both ridges are collinear along a diameter of the face F2. Each ridge, R1, R2, R3 and R4, possesses a triangular cross-section, it being isosceles with respect to its axis or symmetry and essentially uniform in shape along its full length.

The face F1 also possesses two trenches T1 and T2, wherein the centerline of each trench lies collinear along a diameter of the face F1 that is perpendicular to the diameter along which lie the ridges R1 and R2. Likewise, face F2 comprises trenches T3 and T4, wherein the centerline of each trench lies collinear along a diameter of the face F2 that is perpendicular to the diameter along which lie the ridges R3 and R4. Each trench, T1, T2, T3 and T4, comprises an inverted triangular cross-section, isosceles with respect to its vertical axis and essentially uniform in shape along its full length.

The ridges R1, R2, R3 and R4 and the trenches T1, T2, T3 and T4, are therefore located such that when the sections 10 and 12 of the journal 2 are positioned coaxially with the axis X, with their respective faces F1 and F2 facing one another, the sections 10 and 12 can be rotated such that ridges R1 and R2 face and align to trenches T3 and T4, and ridges R3 and R4 face and align to trenches T1 and T2. When faces F1 and F2 are then brought together, such that their respective surfaces S1 and S2 approach or touch one another, the ridges R1 and R2 fit snugly into the reciprocal trenches T3 and T4, the ridges R3 and R4 fit snugly into the reciprocal trenches T1 and T2, and the journal 2 properly conjoins with the correct angular orientation between its sections 10 and 12.

By constraining the lateral and longitudinal relationship between sections 10 and 12 when both are properly conjoined, the ridges R1, R2, R3 and R4 and the trenches T1, T2, T3 and T4, thereby act in unison as an orientation means that serves to correctly locate and align the two sections 10 and 12 rotationally about the axis X with respect to each other.

Figure 4:
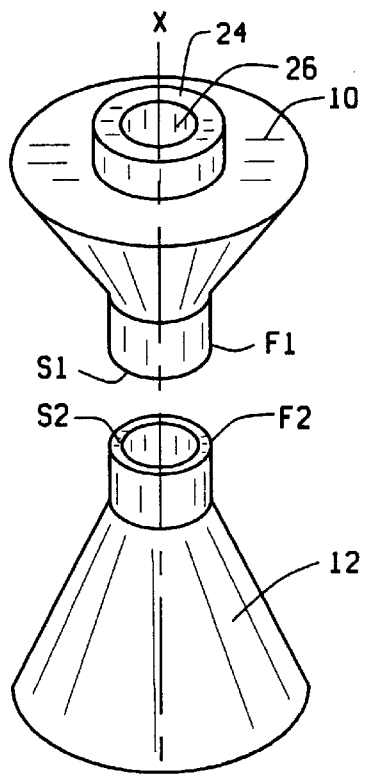
FIG. 4 is a perspective view of both sections of the journal, separated, and at an early process stage.
Figure 5:
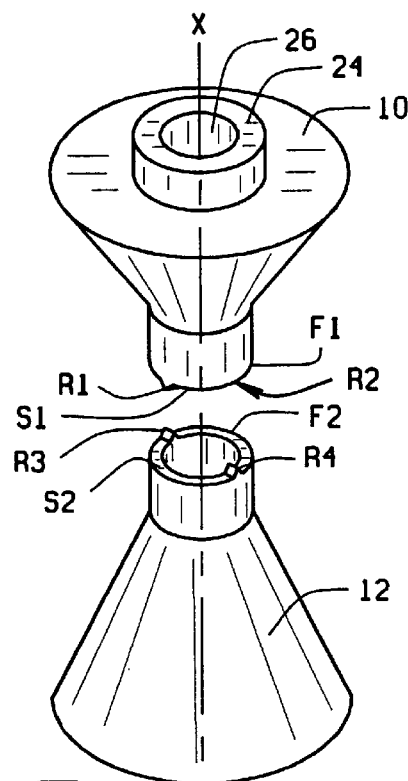
FIG. 5 is a perspective view of both sections of the journal, separated, and at an intermediate process stage prior to "coining"
Figure 6:
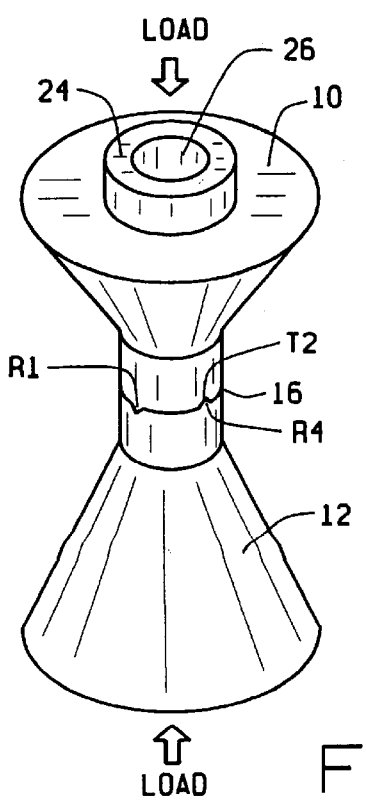
FIG. 6 is a perspective view of both sections of the journal, pressed together during the "coining" process.
Figure 7:
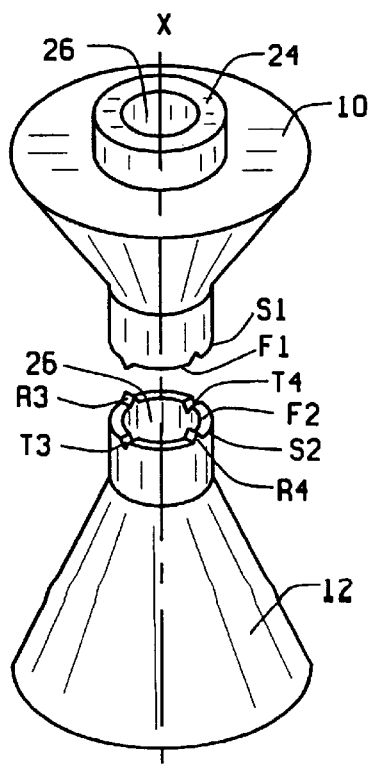
FIG. 7 is a perspective view of both sections of the journal, separated, after "coining"
Figure 8:
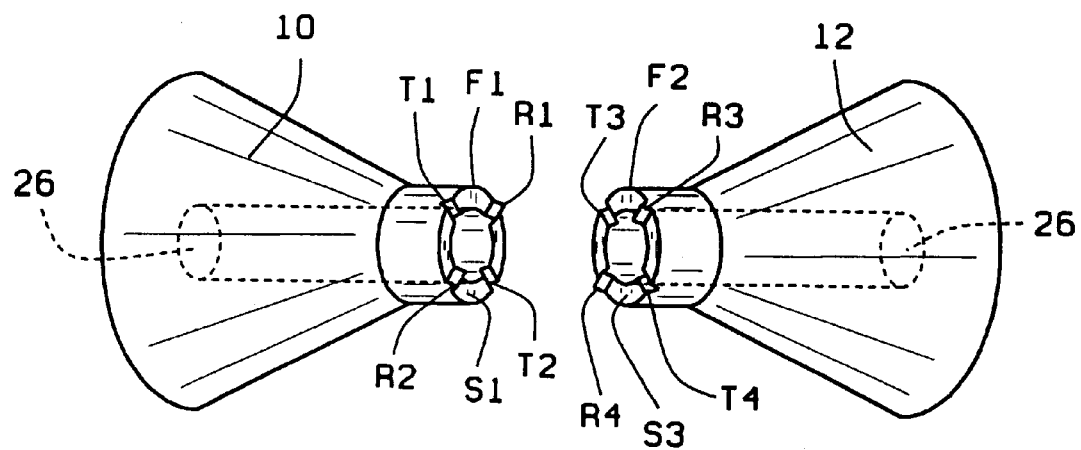
FIG. 8 is a lateral view of both sections of the completed journal, separated and rotated to expose the "coined" surfaces.

Precise fit of the ridges R1, R2, R3 and R4 into the trenches T1, T2, T3 and T4 requires a novel application of a manufacturing process referred to as "coining." First, each section 10 and 12 is machined to its final shape, less the ridges and trenches, using standard turning practices (FIG. 4). Material is then removed from each face F1 and F2 to form the ridges R1, R2, R3 and R4 (FIG. 5). The faces F1 and F2 are then abutted against one another such that both are coaxial with the axis X and the line between the ridges R1 and R2 is perpendicular to the line between the ridges R3 and R4. A compressive load is then applied along the axis X in an amount sufficient to press the surface S1 of the face F1 against the surface S2 of the face F2, such that the ridges R1, R2 and R3, R4 compress into and plastically deform the surfaces S2 and S1, respectively (FIG. 6). This results in the permanent formation of the trenches T1, T2, T3 and T4 that constitute corresponding mirror images to the ridges R1, R2, R3 and R4 (FIG. 7). When conjoined, the two sections 10 and 12 form an assembly. The assembly is then ground and superfinished as a single unit, to essentially the final configuration for the journal 2, to ensure the uniform roundness and concentricity about the axis X between the sections that is critical to proper bearing operation.

During final bearing assembly, the two sections 10 and 12 are brought together at interface 16 within the interior of the hub 4 (FIG. 1), and the ridges R1, R2, R3 and R4 and trenches T1, T2, T3 and T4 jointly act as a guide to properly align the sections coaxially with the axis X. Upon properly and positively mating the ridges and trenches, the ridges and trenches act as a locking mechanism to secure sections 10 and 12 from undesirable lateral and/or rotational shifts. The two sections 10 and 12 are thereby brought together within the hub 4 such that they are aligned axially as well as rotationally, and are thus in the same orientation with respect to each other as they were during the journal manufacturing process.

Variations on the basic construction and process are available. For example, the hub 4 may be stationary and the journal 2 may rotate. The grooves 32 may be formed in the journal 2 instead of the liner 6. The grooves 32 may be formed in the surfaces 40 of the hub 4 and thereby translated into the form of the liner 6. The grooves 32 may be formed at the small diameter ends of the conical surfaces of the journal 2 or the hub 4, rather than the larger ends, and will then be configured to pump away from the intervening surface 20.

The liner 6 may be bonded to the conical surfaces 18 of the journal 2 instead of the surfaces 40 of the hub 4, in which event the coating C may be applied to the conical surfaces 40 of the hub 4. The coating C may also be applied to both the surface 18 of the journal 2 and onto the liner 6 bonded to the hub 4. Alternately, the coating C may be applied to one or both of the surface 40 of the hub 4 and the liner 6 if the liner is bonded to the journal 2, or the coating C may be applied just on the liner 6 if the liner 6 is bonded to both the hub 4 and the journal 2. The journal 2 may remain stationary while the hub 4 rotates, or the journal 2 may rotate about a stationary hub 4. Further, the bearing A may be configured without an integral motor.

The coating C itself may consist of one or more layers, and not specifically three, so long as the desired levels of adhesion, and chemical and mechanical durability can be achieved. The coating C may also be applied in a variety of other processes, such as chemical vapor deposition, low pressure chemical vapor deposition, and wet bath chemical deposition, and may be applied in more than one continuous process. Materials, such as chromium, may be used in place of titanium and tungsten for adhesion. The coating C may be formulated to exhibit a hardness greater than that of the substance upon which it is bonded.

In addition, the ridges R1, R2, R3 and R4 and their corresponding trenches T1, T2, T3 and T4 may be formed with cross-sectional shapes other than isosceles triangles, may be of different dimensions and may not necessarily be constrained to run collinear with a diameter of the face F1 or F2. Further, the ridges and trenches may be formed earlier or later in the bearing manufacturing process. For example, the entire journal 2 may be first cut and machined from a single piece of bar stock before being split at the center intervening section 20 to allow for formation of the ridges and trenches. The above-described "coining" process may also be utilized on the two sections 36 and 38 of the hub 4.

As various changes could be made in the above constructions without departing from the scope of the invention, it is intended that all matter contained in the above description or shown in the accompanying drawings shall be interpreted as illustrative and not in a limiting sense.

What is claimed is:

1. A process for improving the durability of a fluid bearing having first and second members, each member having a tapered surface, one of which rotates relative to the other about an axis such that a gap normally exists between the members, but such that on occasion the members contact each other, said process comprising: bonding to the first member, in the region of the gap between the members, a coating which isolates the first member from the second member in that region, the coating having both coefficient of friction and chemical reactivity lower than that of the substance of the first member as to the substance of the second member, and wherein the step of applying the coating comprises applying an adhesion layer to the substance of the first member and applying a final layer over the adhesion layer; wherein the adhesion layer essentially comprises a material selected from the group consisting of: (a) titanium; (b) tungsten; and (c) chromium; and wherein the final layer essentially comprises a material selected from the group consisting of: (a) amorphous carbon; (b) hydrogenated amorphous carbon; (c) amorphous carbon and titanium; (d) hydrogenated amorphous carbon and titanium; (e) amorphous carbon and tungsten; (e and hydrogenated amorphous carbon and tungsten.

2. The process according to claim 1 wherein the step of applying the coating further comprises bonding a gradient layer to the adhesion layer and the final layer to the gradient layer with the gradient layer transforming from the composition of the adhesion layer to the composition of the final layer.

3. The process according to claim 1 wherein the coating is applied by sputtering.

4. The process according to claim 1 and further comprising applying the coating to the second member.

5. The process according to claim 2 wherein the adhesion layer consists essentially of titanium and the final layer consists essentially of amorphous carbon and titanium, and further comprising the following:
   a. plasma etching the first surface prior to coating in order to remove contaminants and generate nucleation sites for adhesion;
   b. all three layers of the coating are applied in a continuous sputtering process.

6. The process according to claim 5 wherein the final layer comprises a thickness of approximately 0.8 to 0.9 micrometers, the gradient layer comprises a thickness of approximately 0.1 micrometers, and the adhesion layer comprises a thickness of approximately 0.1 micrometers.

7. The process according to claim 5 wherein the sputtering process parameters are regulated to deposit a final layer having the following material characteristics: (a) a titanium impurity level of approximately 3 to 5 atomic percent; (b) a physical structure incorporating 1.0 to 3.0 nanometer titanium carbide particles embedded in a matrix of amorphous carbon; (c) a hardness of 15 gigapascals, as measured using nanoindention techniques; (d) a dry sliding friction coefficient of approximately 0.08, measured at a rate of 50 centimeters per second with a 1.0 gigapascal load and at 25% relative humidity; and (e) an rms surface roughness of approximately 5 nanometers.

8. The process according to claim 2 wherein the adhesion layer consists essentially of titanium and the final layer consists essentially of hydrogenated amorphous carbon and titanium, and further comprising plasma etching the first surface prior to coating in order to remove contaminants and generate nucleation sites for adhesion; and wherein all three layers of the coating are applied in a continuous sputtering process.

9. The process according to claim 8 wherein the final layer has a thickness of approximately 2.0 to 3.0 micrometers, the gradient layer has a thickness of approximately 0.1 micrometers, and the adhesion layer has a thickness of approximately 0.1 micrometers.

10. The process according to claim 8 wherein the sputtering process parameters are regulated to deposit a final layer having the following material characteristics: (a) a titanium impurity level of approximately 3 to 5 atomic percent; (b) a physical structure incorporating 1.0 to 3.0 nanometer titanium carbide particles embedded in a matrix of hydrogenated amorphous carbon; (c) a hardness of 15 to 25 gigapascals, as measured using nanoindention techniques; (d) a dry sliding friction coefficient of approximately 0.10 to 0.15, measured at a rate of 50 centimeters per second with a 1.0 gigapascal load at 25% relative humidity; and (e) an rms surface roughness of approximately 10 to 20 nanometers.

11. The process according to claim 2 wherein the adhesion layer consists essentially of chromium and the final layer consists essentially of hydrogenated amorphous carbon and titanium, and further comprising the following:
   a. plasma etching the first surface prior to coating in order to remove contaminants and generate nucleation sites for adhesion;
   b. all three layers of the coating are applied in a continuous sputtering process.

12. The process according to claim 11 wherein the final layer has a thickness of approximately 2.0 to 3.0 micrometers, the gradient layer has a thickness of approximately 0.1 micrometers, and the adhesion layer has a thickness of approximately 0.1 micrometers.

13. The process according to claim 11 wherein the sputtering process parameters are regulated to deposit a final layer having the following material characteristics: (a) a tungsten impurity level of approximately 3 to 5 atomic percent; (b) a physical structure incorporating 1.0 to 3.0 nanometer tungsten carbide particles embedded in a matrix of hydrogenated amorphous carbon; (c) a hardness of 15 to 25 gigapascals, as measured using nanoindention techniques; (d) a dry sliding friction coefficient of approximately 0.10 to 0.15, measured at a rate of 50 centimeters per second with a 1.0 gigapascal load at 25% relative humidity; and (e) an rms surface roughness of approximately 10 to 20 nanometers.

14. A fluid bearing for accommodating rotation about an axis, said bearing comprising first and second members, each member having a tapered surface, one of which surrounds the other, the first member having a coating bonded to a region of the first member that is presented toward the second member, the coating having both coefficient of friction and chemical reactivity lower than the substance of the first member as to the substance of the second member, there normally being a gap between the first and second members at the coating during their relative rotation, but which gap may at times close, whereby the coating will deter wear of the members should they come into contact, and wherein the coating comprises an adhesion layer that is bonded to the second member and a final layer which forms the outer surface of the coating and lies over the adhesion layer, the adhesion layer essentially comprising a material selected from the group consisting of: (a) titanium; (b) tungsten; and (c) chromium; and wherein the final layer essentially comprises a material selected from the group consisting of: (a) amorphous carbon; (b) hydrogenated amorphous carbon; (c) amorphous carbon and titanium; (d) hydrogenated amorphous carbon and titanium; (e) amorphous carbon and tungsten; (f) and hydrogenated amorphous carbon and tungsten.

15. The fluid bearing according to claim 14 wherein the coating further includes a gradient layer located between the adhesion layer and the final layer, having a composition that essentially transforms from the composition of the adhesion layer to the composition of the final layer.

16. The fluid bearing according to claim 14 wherein the coating is also bonded to the region of the second member presenting toward the first member.

17. The fluid bearing according to claim 14 wherein the layers are applied by sputtering.

18. The fluid bearing according to claim 15 wherein the adhesion layer comprises essentially titanium and a thickness of approximately 0.1 micrometers; the gradient layer comprises a thickness of approximately 0.1 micrometers; and the final layer comprises essentially amorphous carbon and titanium, a thickness of approximately 0.8 to 0.9 micrometers, and the following material characteristics: (a) a titanium impurity level of approximately 3 to 5 atomic percent; (b) a physical structure incorporating 1.0 to 3.0 nanometer titanium carbide particles embedded in a matrix of amorphous carbon; (c) a hardness of 15 gigapascals, as measured using nanoindention techniques; (d) a dry sliding friction coefficient of approximately 0.08, measured at a rate of 50 centimeters per second with a 1.0 gigapascal load at 25% relative humidity; and (e) an rms surface roughness of approximately 5 nanometers.

19. The fluid bearing according to claim 15 wherein the adhesion layer comprises essentially titanium and thickness of approximately 0.1 micrometers; the gradient layer comprises a thickness of approximately 0.1 micrometers; and the final layer comprises essentially hydrogenated amorphous carbon and titanium, a thickness of approximately 2.0 to 3.0 micrometers, and the following material characteristics: (a) a titanium impurity level of approximately 3 to 5 atomic percent; (b) a physical structure incorporating 1.0 to 3.0 nanometer titanium carbide particles embedded in a matrix of hydrogenated amorphous carbon; (c) a hardness of 15 to 25 gigapascals, as measured using nanoindention techniques; (d) a dry sliding friction coefficient of approximately 0.10 to 0.15, measured at a rate of 50 centimeters per second with a 1.0 gigapascal load at 25% relative humidity; and (e) an rms surface roughness of approximately 10 to 20 nanometers.

20. The fluid bearing according to claim 15 wherein the adhesion layer comprises essentially chromium and a thickness of approximately 0.1 micrometers; the gradient layer comprises a thickness of approximately 0.1 micrometers; and the final layer comprises essentially hydrogenated amorphous carbon and tungsten, a thickness of approximately 2.0 to 3.0 micrometers, and the following material characteristics: (a) a tungsten impurity level of approximately 3 to 5 atomic percent; (b) a physical structure incorporating 1.0 to 3.0 nanometer tungsten carbide particles embedded in a matrix of hydrogenated amorphous carbon; (c) a hardness of 15 to 25 gigapascals, as measured using nanoindention techniques; (d) a dry sliding friction coefficient of approximately 0.10 to 0.15, measured at a rate of 50 centimeters per second with a 1.0 gigapascal load at 25% relative humidity; and (e) an rms surface roughness of approximately 10 to 20 nanometers.

21. A process for assuring that first and second sections of a fluid bearing member which are normally joined at end faces on the sections, yet are separable at the end faces, remain in the proper angular and rotational orientation with respect to each other when separated and thereafter joined together, said process comprising: forming a raised feature on the end face of the first section and forcing the two sections together with their end faces in abutment and with sufficient force to plastically deform the second section at its end face, whereby the second section acquires a trench that conforms in cross-section to the raised feature.

22. The process according to claim 21 wherein each section at its end face has a raised feature and a trench that conforms in cross-section to the raised feature on the end face of the other section.

23. The process according to claim 22 wherein the member is first formed into its final configuration from a single piece of bar stock before being separated into the two sections.

24. The process according to claim 22 wherein the member is formed into its final configuration after the trenches are formed in each section's end face.

25. A fluid bearing for accommodating rotation about an axis, said bearing comprising first and second members, one of which surrounds the other, the first member having first and second sections which are joined together and configured such that the first member cannot be withdrawn from the second member without separating the sections of the first member, each section having an end face at which the sections abut when the sections are together, the first section having a ridge transversely extending across its end face, and the second section having a trench extending transversely across its end face which receives the ridge, the trench having been formed as a consequence of the ridge having been forced into the end face of the second section with sufficient force to plastically deform the end face, whereby the trench in cross section precisely conforms to the rib.

26. The fluid bearing according to claim 25 wherein both sections have ridges and trenches, with the trenches having been formed by plastic deformation; and wherein the ridges of the two sections are oriented at substantially a right angle to one another.

27. The fluid bearing according to claim 26 wherein the ridges and trenches are substantially linear, lie along diameters of the end faces perpendicular to one another, and have essentially triangular cross-sections.

* * * * *